United States Patent
Yoshimura

(10) Patent No.: US 6,867,475 B2
(45) Date of Patent: Mar. 15, 2005

(54) SEMICONDUCTOR DEVICE WITH AN INDUCTIVE ELEMENT

(75) Inventor: Tetsuo Yoshimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/460,403

(22) Filed: Jun. 13, 2003

(65) Prior Publication Data

US 2004/0004255 A1 Jan. 8, 2004

(30) Foreign Application Priority Data

Jul. 4, 2002 (JP) .................................. 2002-196118

(51) Int. Cl.[7] .................... H01L 29/00; H01L 21/8238
(52) U.S. Cl. .................... 257/531; 257/277; 257/379; 257/516; 438/210; 438/329
(58) Field of Search ................. 257/277, 379, 257/516, 531; 438/200, 210, 329

(56) References Cited

U.S. PATENT DOCUMENTS

| 6,426,543 | B1 | * | 7/2002 | Maeda et al. ............... 257/531 |
| 6,452,249 | B1 | * | 9/2002 | Maeda et al. ............... 257/531 |
| 2001/0048135 | A1 | * | 12/2001 | Leipold ...................... 257/369 |
| 2003/0151115 | A1 | * | 8/2003 | Kanematsu ................ 257/531 |

* cited by examiner

*Primary Examiner*—Minh-Loan Tran
(74) *Attorney, Agent, or Firm*—Westerman, Hattori Daniels & Adrian LLP

(57) ABSTRACT

There is provided a semiconductor device able to prevent performance degradation of an inductor element provided thereon. A high resistance region is provided below the inductor element formed on the semiconductor substrate. The high resistance region is formed deeper than the well regions of the p-channel and n-channel MOS transistors, thus preventing induction of an eddy current by the magnetic flux generated from the inductor element.

10 Claims, 15 Drawing Sheets

SEMICONDUCTOR DEVICE WITH AN INDUCTIVE ELEMENT

CROSS-REFERENCES TO RELATED APPLICATIONS

This patent application is based on Japanese priority patent application No. 2002-196118 filed on Jul. 4, 2002, the entire contents of which are hereby incorporated by reference.

BACKGROUND OF THE INVENTION

1. Field of the Invention

The present invention relates to a semiconductor device such as a cellular phone, a PDA or others (Personal Digital Assistant) used in a frequency band from a few MHz to a few GHz, and a method for producing the same, particularly, to a semiconductor device including bipolar devices, MOS devices and other active elements carrying passive elements like inductor elements, and a method for producing the same.

2. Description of the Related Art

Conventionally, an electronic circuit device is formed by mounting inductors, condensers or other passive elements together with active elements on an electronic circuit board. However, reduction of sizes, thicknesses, or weights of electronic circuit devices is being strongly demanded, especially for cellular phones and PDAs. In order to meet this demand, studies and developments have been made in regard to further increasing compactness and degree of integration of electronic circuit devices. As one method of increasing the packaging density, the MMIC (monolithic microwave integrated circuit) has been developed. The MMIC is a high frequency integrated circuit obtained by forming active elements such as transistors, and passive elements such as resistors and inductors integrally in a semiconductor process.

FIG. 1 is a perspective view of a CMOS device of the related art with an inductor element formed therein. Referring to FIG. 1, the CMOS device 100 comprises MOS transistors 102 and element separation regions 103 formed on a semiconductor substrate 101, an interconnection structure 104 formed on the semiconductor substrate 101 and connected to MOS transistors 102, and an inductor element 105 formed on the interconnection structure 104 in a spiral shape.

By forming an inductor element on a CMOS device in this way, much higher compactness is obtainable comparing with attaching an external inductor element, thus it is suitable for cellular phones.

Turning to the problem to be solved by the present invention, it is known that the larger the Q-value (Quality factor) of an inductor element, the higher the performance thereof. But, for example, if the inductor element 105 is formed on the CMOS device 100, because of the electrical and capacitive coupling between the inductor element 105 and the semiconductor substrate 101, the Q-value of the inductor element 105 decreases. For example, as schematically shown in FIG. 2, if the resistivity of the semiconductor substrate 101 is low, the change of the magnetic field generated by the inductor element 105 induces an eddy current in the semiconductor substrate 101. This eddy current flows in a direction hindering the change of the magnetic field generated by the inductor element, therefore lowering the Q-value.

To address this problem, there is a method involving increasing the resistivity of the substrate so as to enhance the Q-value of the inductor element. FIG. 3 shows the relation between the Q-value of the inductor element and the resistivity of the substrate.

Referring to FIG. 3, it is clear that the Q-value increases when resistivity of the substrate increases.

Nevertheless, for example, in a CMOS fabrication process, since impurity elements are implanted and diffused in the semiconductor substrate to form impurity diffusion regions such as well regions; the electrical resistivity in these regions decrease, and the eddy current turns to be induced easily. In the following, as an example, an explanation will be made of the fabrication process of a CMOS device.

FIGS. 4A through 4C show a fabrication process of a CMOS device.

In the step shown in FIG. 4A, by STI, silicon dioxide is buried into the silicon substrate 111, which has a substrate resistivity of, for example, 1 kΩ·cm, and element separation regions 112 having a depth of 300 nm are formed to separate device regions 113A and 113B.

Further, in the step shown in FIG. 4A, by a resist process, one device region 113B is covered by a resist. Then by ion-implantation, p-type dopant ions $B^+$ are accelerated to 300 keV and are implanted into the other device region 113A at a density of $1 \times 10^{13}$ cm$^{-2}$ to form a p-well region 114.

Next, the resist is removed, and by using a mask inverted to that used in the above resist step, the device region 113A for the p-well region 114 and others are masked. In the same way, n-type dopant ions $P^+$ are implanted to form an n-well region 115. Note that an impurity diffusion region 116 is also formed below the un-masked region 112C.

Next, in the step shown in FIG. 4B, a gate oxide film 117 is deposited to a thickness of 2 nm in the device regions, and above it, a poly-silicon film is deposited to a thickness of 180 nm, then gate electrodes 118 are formed by a resist process.

Further, in the step shown in FIG. 4B, a 100 nm thick silicon dioxide film is formed, and etch-back is performed by RIE (reactive ion etching) to form sidewalls 119. Next, in the same way as formation of the well regions, dopant ions are implanted to form source and drain regions 120.

Next, in the step shown in FIG. 4C, the inter-layer insulating film 121 and plugs 122, and the interconnection layer 123 are formed. Then, polishing and flattening are carried out by CMP (Chemical Mechanical Polishing) to form a multilayer interconnection structure.

In the step shown in FIG. 4C, furthermore, a film made of Al or other metals is deposited by sputtering on the multilayer interconnection structure to a thickness of 150 nm, and a spiral shape inductor element 124 is formed by photolithography and dry-etching. In this way, a CMOS device having an inductor element on the surface thereof is formed.

As explained in FIG. 4A, when implanting $B^+$ dopant ions, since the element separation region 112C just below the inductor element 124 is not masked, the impurity diffusion region 116 is also formed below the element separation region 112C. Although the semiconductor substrate 111 in an intrinsic state has a high resistivity, in such impurity diffused regions, the semiconductor substrate 111 turns to be conductive. So below the element separation region 112C, an eddy current is induced by the AC (alternative current) magnetic field generated by the inductor element 124. As the eddy current flows in a direction hindering the change of the magnetic field, there arises the aforesaid problem that the Q-value thereof degrades.

SUMMARY OF THE INVENTION

Accordingly, it is a general object of the present invention to solve the above problems of the related art.

A more specific object of the present invention is to provide a semiconductor device able to suppress and prevent the occurrence of an eddy current induced by a magnetic field of an inductor element, and thus able to prevent degradation of performance of the inductor element, and a method for producing the same.

To attain the above object, according to a first aspect of the present invention, there is provided a semiconductor device comprising a semiconductor substrate having a predetermined substrate resistivity, a device region formed in the semiconductor substrate, impurity diffusion regions formed in the device region, an inductor element formed on a first surface of the semiconductor substrate; and a high resistance region formed in the semiconductor substrate facing the inductor element, which has a resistivity higher than that of the semiconductor substrate.

According to the above invention, by forming a high resistance region in the semiconductor substrate facing the inductor element, in other words, below the inductor element, an eddy current is not induced by the magnetic field of the inductor element below the inductor element because of the high resistivity of the high resistance region.

Preferably, the high resistance region is formed at a position farther than the impurity diffusion regions relative to the first surface of the semiconductor substrate.

According to the above invention, since the high resistance region is formed at a position farther than the impurity diffusion region relative to the surface of the semiconductor substrate, in other words, deeper than the impurity diffusion region relative to the surface of the semiconductor substrate, in the semiconductor substrate, impurity diffusion regions are not formed below the high resistance region, thus the resistivity of this region is higher than that of the impurity diffusion region. Therefore, induction of an eddy current can hardly happen even below the high resistance region, and this enables prevention of degradation of performance of the inductor element caused by eddy current induction.

Preferably, the high resistance region is formed in such a way that there is not any said impurity region existing between said high resistance region and a region of said semiconductor substrate having the substrate resistivity.

According to the above invention, there is not any impurity diffusion region formed below the high resistance region in the semiconductor substrate. Therefore, induction of an eddy current can hardly happen in the semiconductor substrate having a resistivity higher than the impurity regions, and this enables prevention of degradation of the performance of the inductor element caused by induction of the eddy current.

Preferably, the high resistance region includes grooves. Due to the grooves in the high resistance region, even an eddy current is generated in this region, the eddy current can be divided.

Alternatively, the high resistance region may have a porous portion. Since a porous material provides a space of a complicated shape, it is difficult for an eddy current to form a closed circuit in the material, therefore induction of an eddy current is suppressed.

Preferably, a depressed portion is formed on a second surface of the semiconductor substrate facing said inductor element.

According to the above invention, a depressed portion is formed on a second surface of the semiconductor substrate facing said inductor element, for example, on a rear surface of the semiconductor substrate. Due to this, the volume of the semiconductor substrate where the eddy current induction occurs is reduced, so the eddy current is suppressed. This enables prevention of degradation of the performance of the inductor element caused by induction of the eddy current.

To attain the above object, according to a second aspect of the present invention, there is provided a method for producing a semiconductor device, comprising the steps of forming a high resistance region in a semiconductor substrate, said high resistance region having a resistivity higher than that of the semiconductor substrate, forming a transistor in a device region formed around the high resistance region, and forming an inductor element on the high resistance region, wherein in the step of forming a transistor, the high resistance region is masked when implanting impurity elements to the device region.

According to the above invention, when forming a transistor, the high resistance region is masked while impurity elements are implanted to the device region. So, impurity elements are implanted to the high resistance region, and this region remains a high resistance region. Due to this, induction of an eddy current is suppressed.

These and other objects, features, and advantages of the present invention will be more apparent from the following detailed description of the preferred embodiments given with reference to the accompanying drawings.

DESCRIPTION OF THE PREFERRED EMBODIMENTS

Below, preferred embodiments of the present invention will be explained with reference to the accompanying drawings.

First Embodiment

The present embodiment relates to an example of a CMOS device in which a high resistance region just below an inductor element is formed deeper than an impurity diffusion region.

Figure 1:
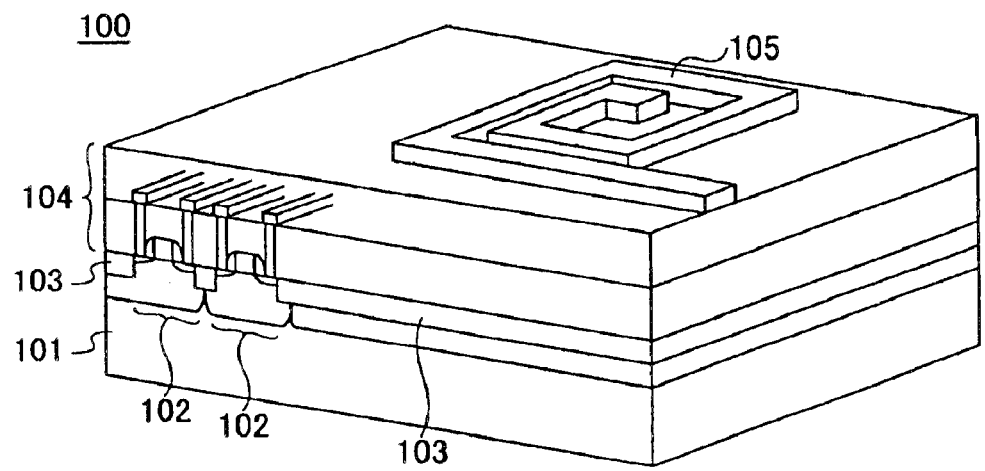
FIG. 1 is a perspective view of a CMOS device of the related art with an inductor element formed therein.
Figure 2:
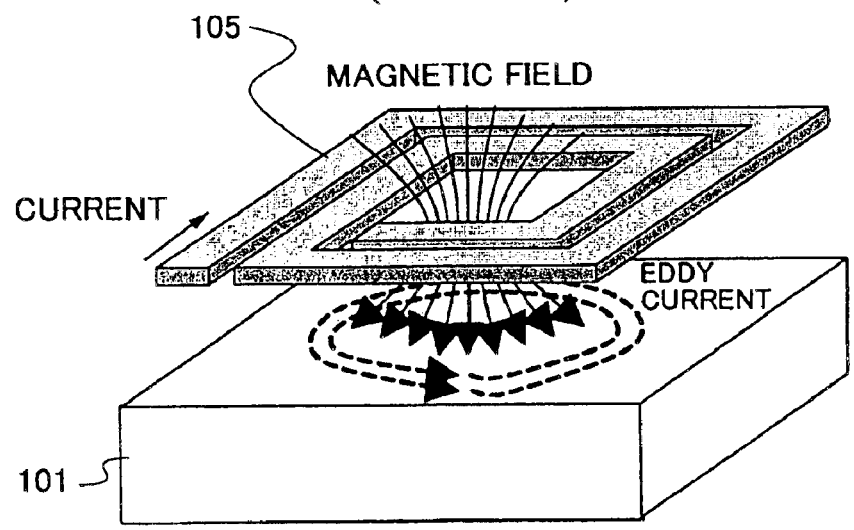
FIG. 2 is a schematic view for explaining induction of an eddy current by the magnetic field of an inductor element.
Figure 3:
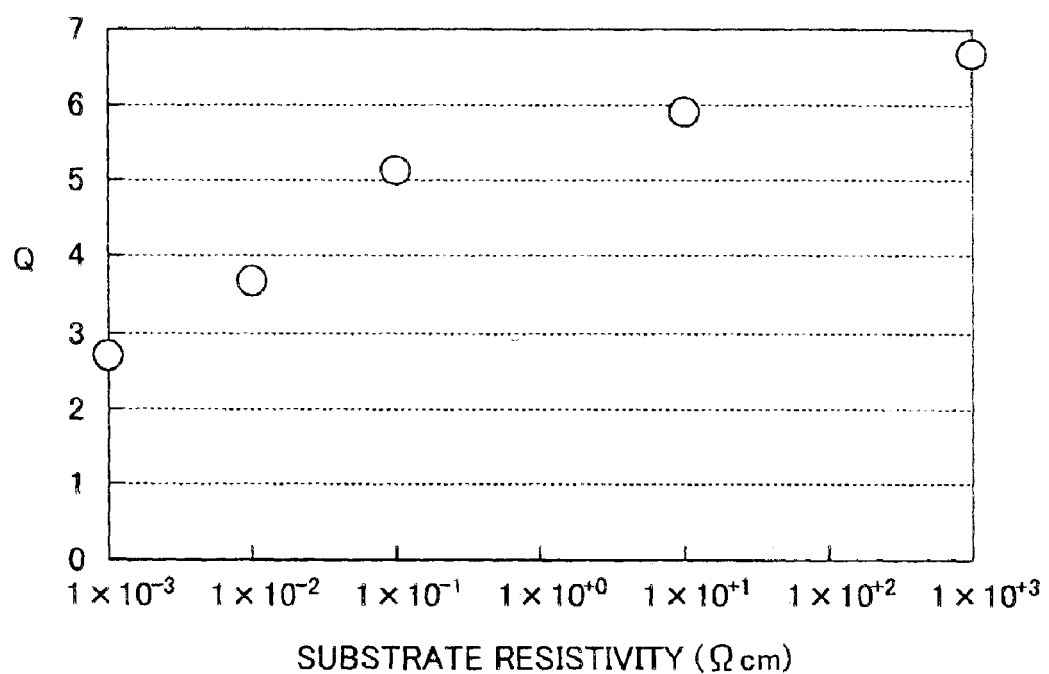
FIG. 3 is a view showing the relation between Q-value and the substrate resistivity.
Figure 4A:
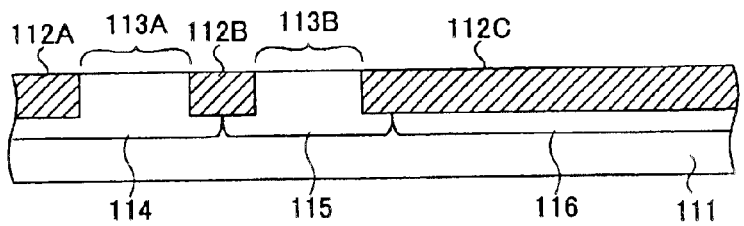
FIGS. 4A through 4C are views showing a process for fabricating the CMOS device of the related art.
Figure 4B:
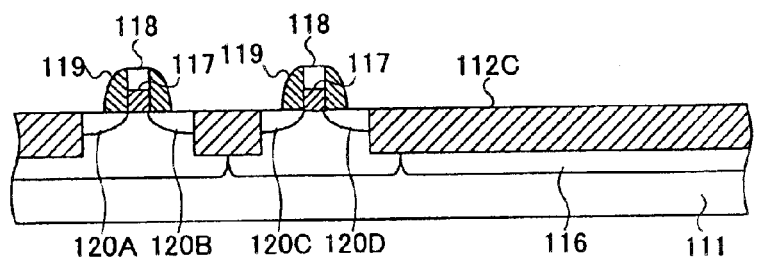
Figure 4C:
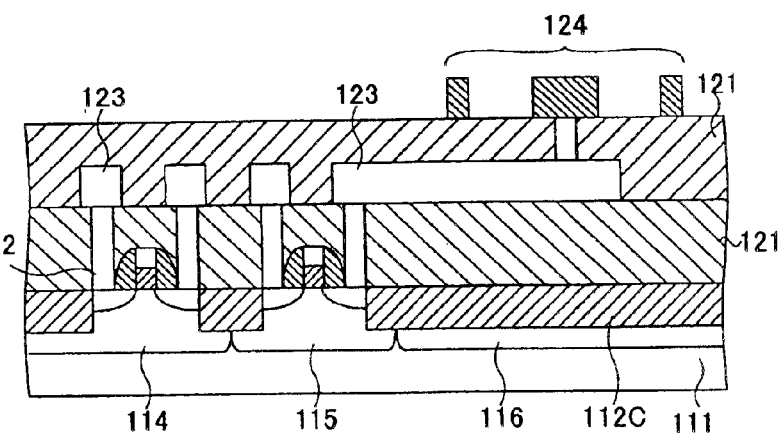
Figure 5:
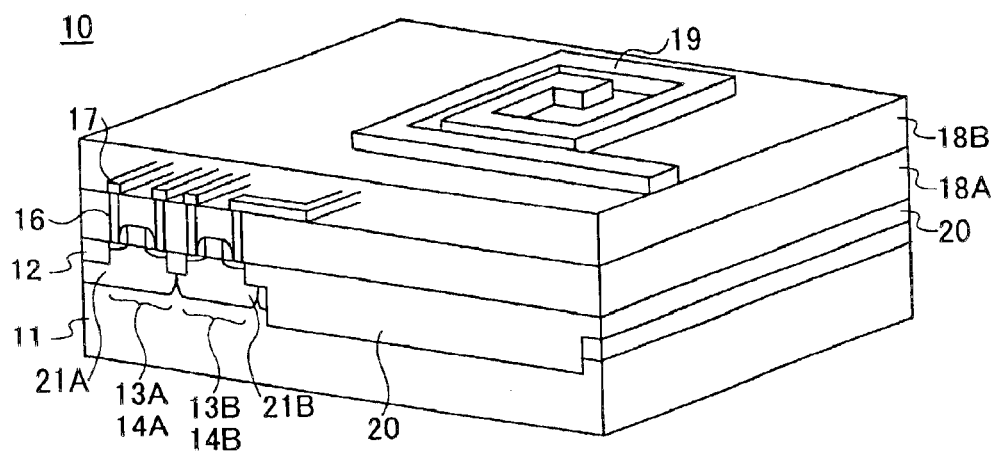
FIG. 5 is a perspective view of a CMOS device according to a first embodiment of the present invention.
Figure 6:
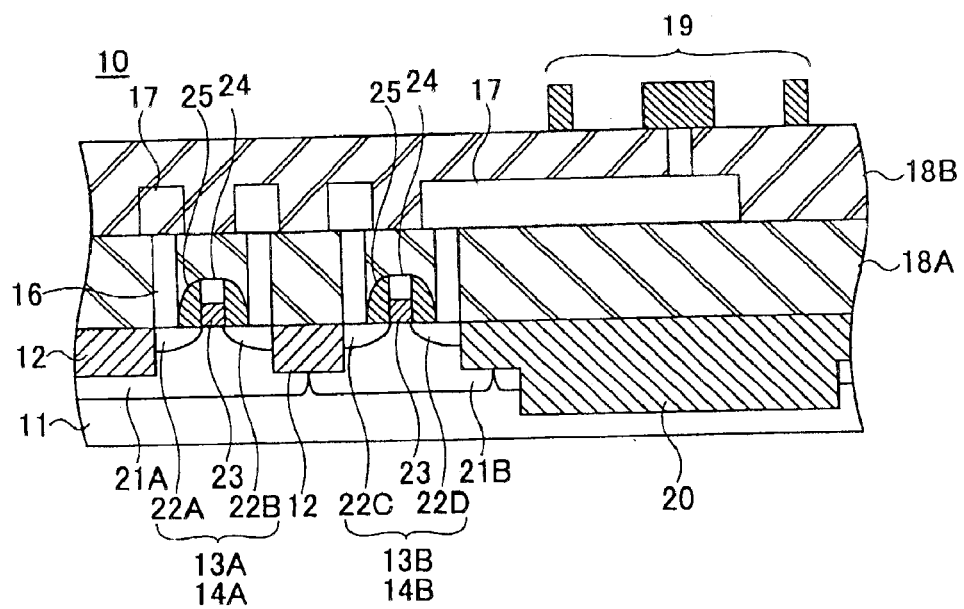
FIG. 6 is a sectional view of the CMOS device according to the first embodiment.

FIG. 5 is a perspective view of the CMOS device of the first embodiment of the present invention, and FIG. 6 is a sectional view of the same.

Referring to FIG. 5 and FIG. 6, the CMOS device 10 of the present embodiment comprises a semiconductor substrate 11, element separation regions 12 formed on the semiconductor substrate 11, device regions 13A and 13B separated by the element separation regions 12, p-channel and n-channel MOS transistors 14A and 14B formed in the device regions 13A and 13B, plugs 16 and an interconnection layer 17 connected to the p-channel and n-channel MOS transistors 14A and 14B, an interlayer insulating film 18, and an inductor element 19 in connection with the plugs 16 or the interconnection layer 17. In addition, a high resistance region 20 just below the inductor element 19 is formed deeper than the well regions 21A and 21B of the p-channel and n-channel MOS transistors 14A and 14B. In the following, detailed description will be given of the CMOS device 10 of the present embodiment.

The semiconductor substrate 11 is formed from silicon of a resistivity (specific resistance), for example, 1 k$\Omega$·cm. From the point of view of suppressing the eddy current induced by the magnetic field of the inductor element 19, higher substrate resistivity is preferable.

The p-channel MOS transistor 14A comprises a n-well region 21A formed by diffusing n-type dopant ions in the semiconductor substrate 11, source and drain regions 22A and 22B formed by diffusing p-type dopant ions, gate insulating films 23 formed from a 2 nm thick silicon dioxide film on the surface of the semiconductor substrate 11, gate electrodes 24 formed from a 180 nm poly-silicon film, and sidewall insulating films 25.

By ion-implantation, n-type dopant ions, for example, P$^+$ ions, are accelerated to 600 keV and are implanted into the n-well region 21A at a density of $1 \times 10^{13}$ cm$^{-2}$. The depth of the n-well, for example, is 1000 nm or so from the surface of the semiconductor substrate 11.

On the other hand, the n-channel MOS transistor 14B comprises a p-well region 21B formed by diffusing dopant ions having opposite conductivity to the p-channel MOS transistor, source and drain regions 22C and 22D formed by diffusing n-type dopant ions, gate insulating films 23 formed from a 2 nm thick silicon dioxide film on the surface of the semiconductor substrate 11, gate electrodes 24 formed from a 180 nm poly-silicon film, and sidewall insulating films 25.

Specifically, by ion-implantation, p-type dopant ions, for example, B$^+$ ions, are accelerated to 300 keV and are implanted into the p-well region 21B at a density of $1 \times 10^{13}$ cm$^{-2}$. The depth of the p-well, for example, is 1000 nm or so from the surface of the semiconductor substrate 11. In addition, because impurities are diffused, the specific resistances of the n-well 21A and p-well 21B turn to be several tens $\Omega$·cm, lower than that of the semiconductor substrate 11.

The interconnection structure includes the plugs 16 formed by tungsten (W) connecting the MOS transistors and their interconnections, the interconnection layer 17 is formed of about 150 nm aluminum (Al) or another metal film, and the interlayer insulating film 18 is formed from a 300 nm silicon dioxide.

The inductor element 19 is formed, for example, in a spiral shape on the interconnection structure, and the two ends thereof are connected to the interconnection layer 17 by the plugs 16.

The inductor element 19 is formed from 150 nm aluminum (Al) or another metal film. Specifically, the inductor element 19 is from 40,000 $\mu$m2 to 250,000 $\mu$m2 in area, and 135 nm to 165 nm in thickness. Note that, for the inductor element 19, besides the spiral shape inductor, a meandering inductor or others can also be used.

In the semiconductor substrate 11 and just below the inductor element 19, the high resistance region 20 is formed. By the fabrication steps shown afterwards, the high resistance region 20 is formed by burying insulating materials such as silicon dioxide films, silicon nitride oxide films, or silicon nitride films in trenches formed in the semiconductor substrate 11.

Furthermore, the high resistance region 20 is formed deeper than the element separation regions 12, and deeper than the lower ends of the p-well 21B and the n-well 21A. The depth of the high resistance region 20, for example, is set to be 1200 nm to 1500 nm from the surface of the semiconductor substrate 11. That is, impurity regions are not formed below the high resistance region 20. For this reason, the electrical resistivity of the region below the high resistance region 20 is equivalent to the substrate resistivity, that is, higher than the electrical resistivity of the p-well 21B and n-well 21A.

By such a configuration, even if the magnetic flux generated when a current flows in the inductor element 19 interlinks with the semiconductor substrate 11, since the high resistance region 20 is insulating, induction of an eddy current is suppressed. Furthermore, since the region below the high resistance region 20 is a portion of the semiconductor substrate 11 without diffused impurities, induction of an eddy current is suppressed by the high substrate resistance. Therefore, degradation of performance of the inductor element 19 can be prevented.

Next, a method for fabricating the CMOS device of the present embodiment will be explained.

FIGS. 7A through 7D and FIGS. 8E and 8F are views showing a process for fabricating the CMOS device according to the first embodiment.

Figure 7A:
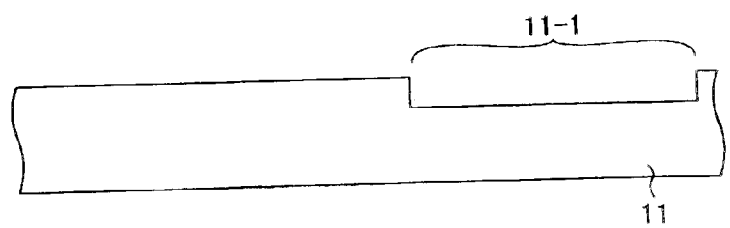
FIGS. 7A through 7D are views showing a process for fabricating the CMOS device according to the first embodiment (part 1)

Referring to FIG. 7A, by photolithography and dry-etching, in the silicon substrate 11 having a substrate resistivity of, for example, 1 k$\Omega$·cm, specifically, in the region just below the inductor element 19 as shown in FIG. 5 and FIG. 6, for example, a trench 11-1 of a depth of 1000 nm is formed. In more detail, the depth of the trench 11-1 is selected so that its sum with the depth to be polished away in the next step is greater than the depths of the n-well 21A and the p-well 21B that are explained later.

Figure 7B:
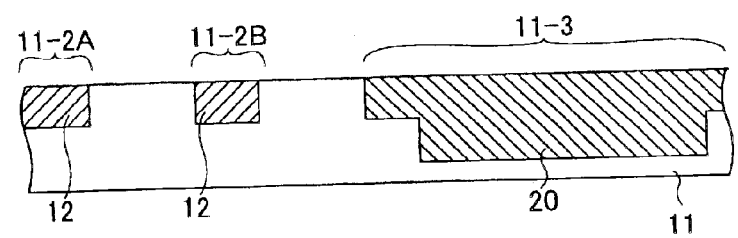

Next, in the step shown in FIG. 7B, still by photolithography and dry-etching, in a broader region including the already formed trench 11-1, for example, a trench 11-3 of a depth of 300 nm is formed, and trenches 11-2A and 11-2B for separating MOS transistors are also formed at the same time. By this step, a 1300 nm deep trench 11-3 is formed in the semiconductor substrate 11 just below the inductor element.

Further, in the step shown in FIG. 7B, by CVD (Chemical Vapor Deposition) or others, a silicon dioxide film is deposited to a thickness of 1600 nm, and trenches 11-2A, 11-2B, 11-3 are buried by the silicon dioxide.

Further, in the step shown in FIG. 7B, the silicon dioxide film is polished by CMP until the semiconductor substrate 11 is exposed. By the above steps, the high resistance region 20 and the element separation regions 12 are formed.

Figure 7C:
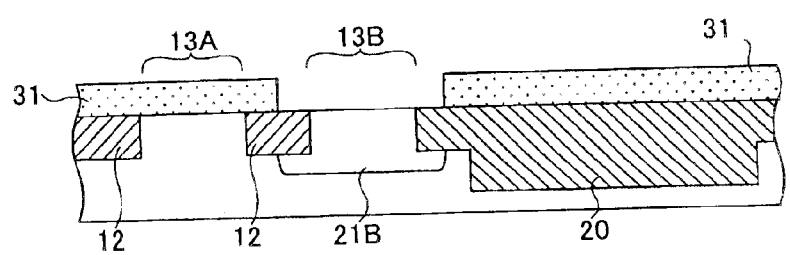

Next, in the step shown in FIG. 7C, by a resist process, patterning is performed using a p-well mask to cover the surface of the substrate with a resist 31 except the region where the n-channel MOS transistor 14B is to be formed. By ion-implantation, B$^+$ dopant ions are accelerated to 300 keV and are implanted into the device region 13B at a density of $1\times10^{13}$ cm$^{-2}$ to form the p-well region 21B.

Specifically, by ion-implantation, for example, B$^+$ dopant ions are accelerated to a predetermined range from 285 keV to 315 keV, and are diffused to a depth from 700 nm to 1000 nm relative to the surface of the semiconductor substrate 11 to form the p-well region 21B.

Figure 7D:
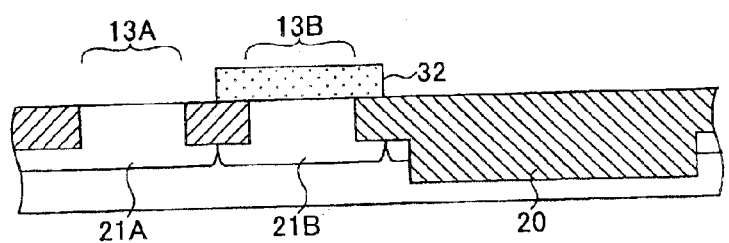

Next, in the step shown in FIG. 7D, resist 31 is removed, and by using an n-well mask that is obtained by inverting the p-well mask used in the above photolithography step, the device region where the p-well region 21B has been formed is covered with a resist 32. Next, by ion-implantation, P$^+$ dopant ions are accelerated to 600 keV and are implanted into the device region 13A at a density of $1\times10^{13}$ cm$^{-2}$ to form the n-well region 21A.

Specifically, by ion-implantation, for example, P$^+$ dopant ions are accelerated to a predetermined range from 570 keV to 630 keV, and are diffused to a depth from 700 nm to 1000 nm relative to the surface of the semiconductor substrate 11 to form the n-well region 21A.

In this step, when implanting P$^+$ dopant ions, a resist mask is not formed in the high resistance region 20 just below the inductor element 19. As a result, the dopant ions are also implanted into the high resistance region 20. However, the high resistance region 20 is formed deeper than the depth that the dopant ions can reach, that is, deeper than the n-well and p-well, consequently, there is no impurity diffusion region formed in the semiconductor substrate below the high resistance region 20.

Further, in the step shown in FIG. 7D, after the resist 32 is removed, annealing is performed for 10 seconds at 1000° C. for activation.

Figure 8E:
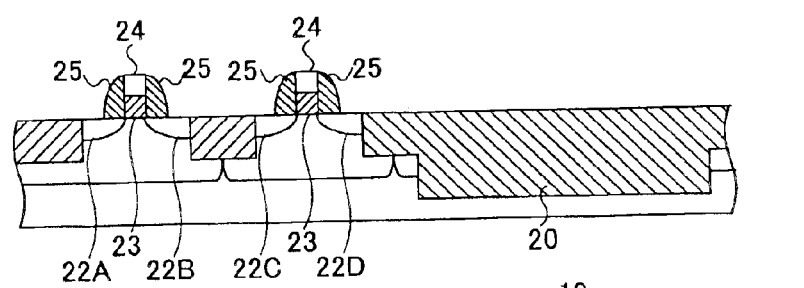
FIGS. 8E and 8F are views showing the process for fabricating the CMOS device according to the first embodiment (part 2)

Next, in the step shown in FIG. 8E, a gate oxide film 23 is deposited to a thickness of 2 nm by thermally oxidizing the surface of the semiconductor substrate 11, and on the gate oxide film 23, a 180 nm thick poly-silicon film is formed by CVD. Next, the gate electrode 24 is formed by dry-etching after patterning using photolithography.

Further, in the step shown in FIG. 8E, by a resist process one device region 13B is masked. By ion-implantation, BF$_2^+$ dopant ions are accelerated to 10 keV and are implanted into the other device region 13A at a density of $1\times10^{14}$ cm$^{-2}$ to form a p-type LDD (Light Doped Drain) region (not shown). Further, As$^+$ dopant ions are accelerated to 10 keV and are implanted into the other device region 13A at a density of $1\times10^{14}$ cm$^{-2}$ to form an n-type LDD region (not shown).

Further, in the step shown in FIG. 8E, a 100 nm silicon dioxide film is formed by CVD, and etch-back is performed by RIE to form sidewalls 25. Next, in the same way as formation of the LDD region, source and drain regions 22A through 22D are formed.

Further, in the step shown in FIG. 8E, by RTA (Rapid Thermal Annealing), heat treatment is performed for three seconds at 1000° C. for activation.

Figure 8F:
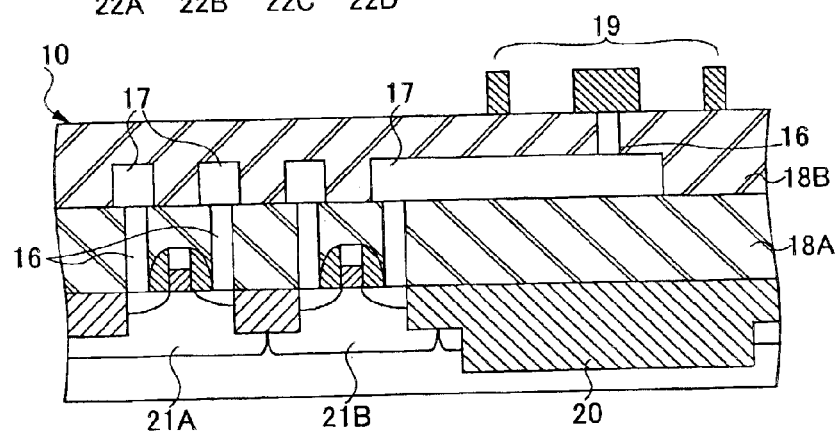

Next, in the step shown in FIG. 8F, a silicon dioxide film is deposited on the surface of the substrate to a thickness of 300 nm by CVD. Next, flattening is carried out by CMP to form the inter-layer insulating film 18A. Then contact holes are opened by photolithography and dry etching, and a tungsten film is deposited to a thickness of 300 nm by CVD, and then polishing is performed by CMP to form plugs 16 in the contact holes.

Further, in the step shown in FIG. 8F, a 150 nm Al film is formed by sputtering, and the interconnection layer 17 is formed by photolithography and dry etching. Next, a 300 nm silicon dioxide film is formed by CVD, and flattening is carried out by CMP to form the inter-layer insulating film 18B. Then the interconnection layer 17 and the plugs 16 are formed in the same way as shown above.

Further, in the step shown in FIG. 8F, an Al or other metal films is deposited on the interconnection structure to a thickness of 150 nm by sputtering, and a spiral shape inductor element 19 is formed by photolithography and dry-etching.

In this way, the CMOS device 10 of the present embodiment is formed.

As shown above, according to the present embodiment, the high resistance region 20 just below the inductor element 19 is formed deeper than the lower ends of the p-well and n-well 21 that are impurity regions. As the high resistance region 20 is an insulating body, it prevents induction of an eddy current, so below the high resistance region 20, impurity regions are not formed, and the high substrate resistivity prevents induction of an eddy current. Accordingly, performance degradation of the inductor element 19 can be prevented.

Second Embodiment

The present embodiment relates to an example of a CMOS device in which a division pattern including a number of grooves is formed on the bottom surface of a high resistance region just below an inductor element. The present embodiment is the same as the first embodiment except for the formation of the division pattern.

Figure 9:
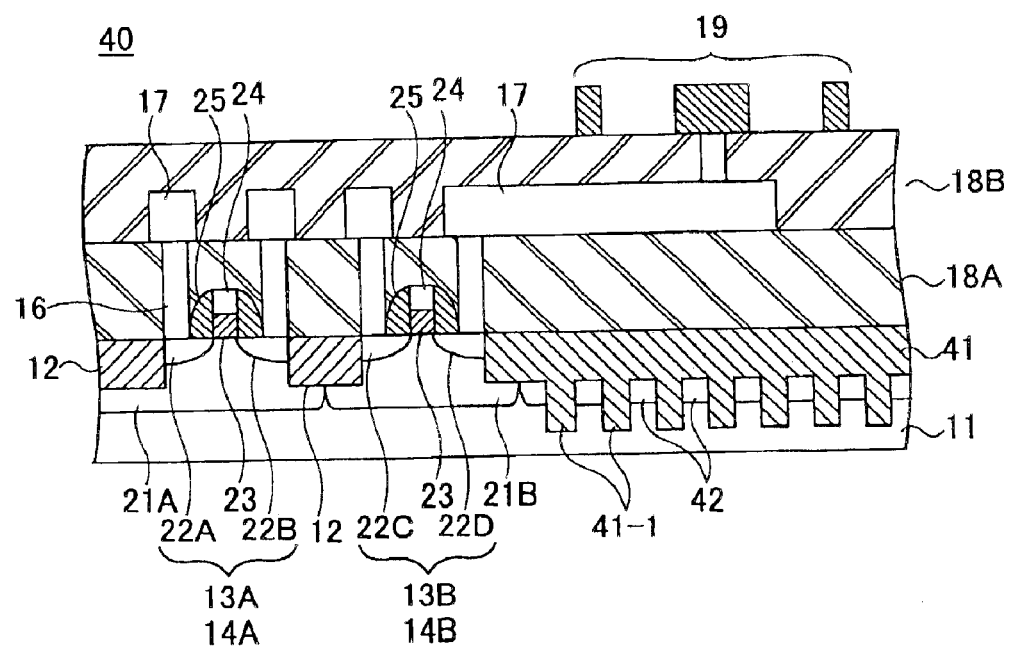
FIG. 9 is a sectional view of the CMOS device according to a second embodiment of the present invention.

FIG. 9 is a sectional view of the CMOS device according to the second embodiment of the present invention. In FIG. 9, the same reference numerals are assigned to the same elements with those explained previously, and explanations thereof will be omitted.

Referring to FIG. 9, the CMOS device 40 of the present embodiment comprises a semiconductor substrate 11, element separation regions 12 formed on the semiconductor substrate 11, device regions 13A and 13B separated by the element separation regions 12, p-channel and n-channel MOS transistors 14A and 14B formed in the device regions 13A and 13B, plugs 16 and an interconnection layer 17 connected to the p-channel and n-channel MOS transistors 14A and 14B, an interlayer insulating film 18, and an inductor element 19 in connection with the plugs 16 or the interconnection layer 17. In addition, a number of grooves 41-1 are formed on the bottom surface of the high resistance region 41 just below the inductor element 19.

The grooves 41-1 at the bottom of the high resistance region 41 just below the inductor element 19, for example, are formed to be 0.1 $\mu$m to 200 $\mu$m in width for each (preferably 1.0 $\mu$m to 2.0 $\mu$m), and 0.1 $\mu$m to 50 $\mu$m in intervals between grooves (preferably 0.5 $\mu$m to 1.0 $\mu$m), and 1200 nm to 1400 nm in depth from the surface of the semiconductor substrate 11, and are formed at least along one direction inside the surface of the semiconductor substrate 11. In the high resistance region 41 and grooves 41-1, there is buried an insulating material like the silicon dioxide film as in the first embodiment.

Further, in the semiconductor substrate 11 between grooves 41-1, impurity diffusion regions 42 are formed. When forming the n-well region 21A, because n-type dopant ions are implanted without a resist mask being provided in the high resistance region 41, the impurity diffusion region 42 is formed to extend to approximately the same depth as the n-well region 21A.

By such a configuration, even if the magnetic flux generated when a current flows in the inductor element 19 nearly perpendicularly interlinks with the semiconductor substrate 11, induction of an eddy current does not occur in the high resistance region 41, just as in the first embodiment. In the impurity diffusion regions 42 of the high resistance region 41 between grooves 41-1, since the electrical resistivity is lower than the substrate resistivity, an eddy current might be induced easily there. However, because the induced eddy current is divided by grooves 41-1 in the high resistance region 41, the induced eddy current is suppressed. Therefore, degradation of performance of the inductor element 19 can be prevented.

Next, a method for fabricating the CMOS device of the present embodiment will be explained.

Figure 10A:
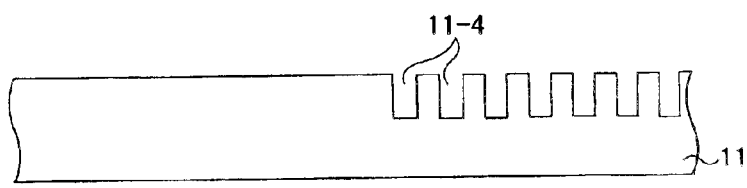
FIGS. 10A and 10B are views showing a process for fabricating the CMOS device according to the second embodiment.
Figure 10B:
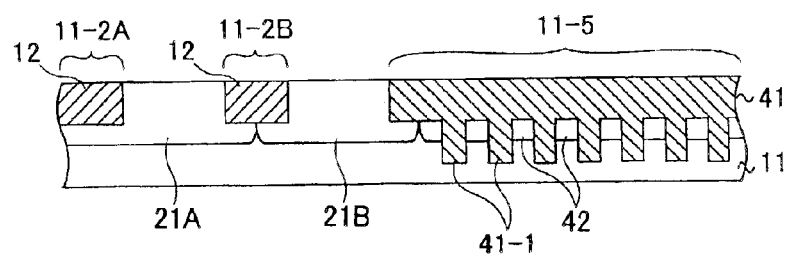

FIGS. 10A and 10B are views showing a process for fabricating the CMOS device according to the second embodiment. Below, overlapping explanations with the first embodiment will be omitted.

In the step shown in FIG. 10A, by photolithography and dry-etching, in the silicon substrate 11 having a substrate resistivity of for example 1 k$\Omega$·cm, trenches 11-4 of a depth of 1000 nm are formed. In more detail, for example, the trenches 11-4 are set to be 900 nm to 1100 nm in depth, 0.1 $\mu$m to 200 $\mu$m (preferably 1.0 $\mu$m to 2.0 $\mu$m) in width for each, and 0.1 $\mu$m to 50 $\mu$m (preferably 0.5 $\mu$m to 1.0 $\mu$m) in intervals between grooves. Such trenches 11-4 are formed in the silicon substrate 11 just below the inductor element 19.

Next, in the step shown in FIG. 10B, still by photolithography and dry-etching, for example, a trench 11-5 of a depth of 300 nm is formed. The depth of the trench 11-5, which is cut to contain the aforesaid trenches 11-4, is 1200 nm to 1400 nm from the surface of the semiconductor substrate 11 to the bottom of the grooves 41-1. Further, trenches 11-2 for separating MOS transistors are also formed.

Further, in the step shown in FIG. 10B, by CVD or others, a silicon dioxide film is deposited to a thickness of 1600 nm, and is then polished and flattened by CMP to form the high resistance region 41 and the element separation regions 12.

Next, in the step shown in FIG. 10B, as shown in FIGS. 7C and 7D in the first embodiment, p-well and n-well regions 21 are formed. As in FIG. 7D, when forming the n-well region, a resist mask is not formed in the high resistance region 41, so the n-type impurity diffusion region 42 is formed between the grooves 41-1 in the high resistance region 41.

The subsequent steps are the same as those shown in FIGS. 8E and 8F in the first embodiment, and by these steps, the CMOS device of the present embodiment as shown in FIG. 9 is formed.

As shown above, according to the present embodiment, the high resistance region 41 just below the inductor element 19 is formed to have a number of grooves 41-1 on its bottom surface, thereby the induced eddy current is divided, and the induction of the eddy current is suppressed. Further, because of the grooves at the bottom of the high resistance region, dishing or other local depressions generated during the flattening step by CMP can be reduced.

Figure 11A:
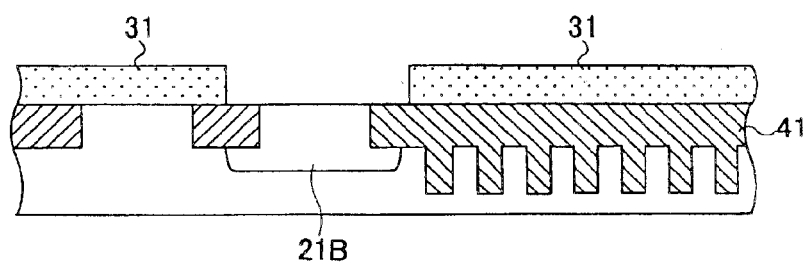
FIGS. 11A and 11B are views showing a process for fabricating a CMOS device according to a modification to the second embodiment.
Figure 11B:
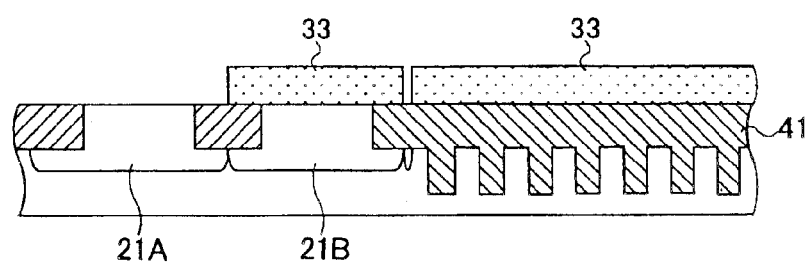

Note that, in the present embodiment, it is shown above that n-type dopant ions are implanted without a resist mask formed in the high resistance region 41 when forming the n-well region 21A, but as shown in steps in FIGS. 11A and 11B, a resist mask may also be formed in the high resistance region 41.

FIGS. 11A and 11B are views showing a process for fabricating a CMOS device according to a modification to the second embodiment.

Referring to FIG. 11A, as in the step of FIG. 10B of the second embodiment, a p-well region 21B is formed. In detail, the device region 13A on the side of the n-well region 21A and the high resistance region 41 are masked by the resist 31, and by ion-implantation, B$^+$ dopant ions are accelerated to 300 keV and are implanted into the device region 13B at a density of 1×10$^{13}$ cm$^{-2}$ to form the p-well region 21B.

Next, in the step shown in FIG. 11B, resist 31 is removed, and the device region 13B on the side of the p-well region 21B and the high resistance region 41 are masked by the resist 33. By ion-implantation, P$^+$ dopant ions are accelerated to 600 keV and are implanted into the device region 13A at a density of 1×10$^{13}$ cm$^{-2}$ to form the n-well region 21A.

In this way, because the dopant ions are not implanted into the high resistance region 41, impurity regions are not formed in the substrate between the grooves 41-1. Accordingly, this substrate region is of the substrate resistivity and is in a high resistivity condition, so induction of an eddy current can hardly occur, and the induction of an eddy current is suppressed. Therefore, performance degradation of the inductor element 19 can be prevented.

Third Embodiment

The present embodiment relates to an example of a CMOS device in which a porous layer is formed in a high resistance region just below an inductor element. The present embodiment is the same as the first embodiment except for the formation of the porous layer.

Figure 12:
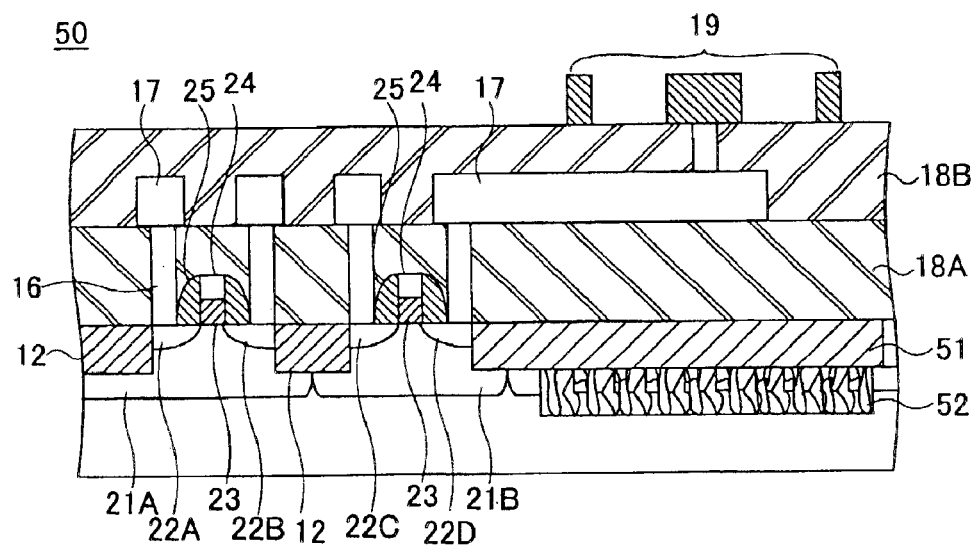
FIG. 12 is a sectional view of the CMOS device according to a third embodiment of the present invention.

FIG. 12 is a sectional view of the CMOS device according to the third embodiment of the present invention. In FIG. 12, the same reference numerals are assigned to the same elements with those explained previously, and explanations thereof will be omitted.

Referring to FIG. 12, the CMOS device 50 of the present embodiment comprises a semiconductor substrate 11, element separation regions 12 formed on the semiconductor substrate 11, device regions 13A and 13B separated by the element separation regions 12, p-channel and n-channel MOS transistors 14A and 14B formed in the device regions 13A and 13B, plugs 16 and an interconnection layer 17 connected to the p-channel and n-channel MOS transistors 14A and 14B, an interlayer insulating film 18, and an inductor element 19 in connection with the plugs 16 or the interconnection layer 17. In addition, a porous layer 52 is formed in the high resistance region 51 just below the inductor element 19.

The porous layer 52 is obtained by converting the silicon of a portion of the semiconductor substrate 11 into a porous condition. For example, its thickness is set to be 900 nm to 1100 nm. Since porous silicon forms a space of a complicated shape, it is difficult for an eddy current to form a closed circuit in this material, and induction of an eddy current is suppressed. Therefore, performance degradation of an inductor element can be prevented.

Next, a method for fabricating the CMOS device of the present embodiment will be explained.

Figure 13A:
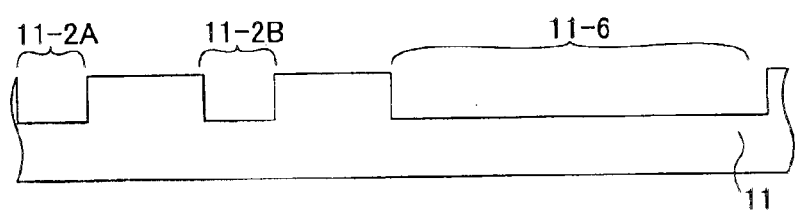
FIGS. 13A through 13C are views showing a process for fabricating the CMOS device according to the third embodiment.
Figure 13B:
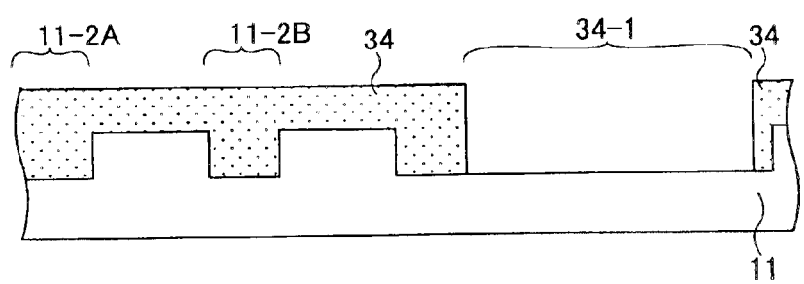
Figure 13C:
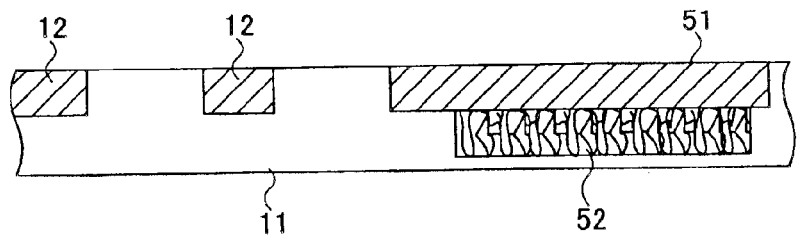

FIGS. 13A through 13C are views showing a process for fabricating the CMOS device according to the third embodiment.

Referring to FIG. 13A, by photolithography and dry-etching, in the silicon substrate 11, trenches 11-2A, 11-2B, 11-6 are formed to be of a depth of 300 nm. These trenches are formed for the element separation regions 12 and the high resistance region 51 just below the inductor element 19.

Next, in the step shown in FIG. 13B, a resist 34 is formed by photolithography with an opening in the portion corresponding to the trench 11-6 just below the inductor element 19.

Next, in the step shown in FIG. 13C, the porous layer 52 is formed in the opening 34-1 in the semiconductor substrate 11. Specifically, by means of anode oxidation, for example, in a HF solution, Pt is used as a cathode, the conversion current is set to be 100 mA/cm$^2$, and the conversion current is supplied for about 12 minutes in the semiconductor substrate 11. As a result, a porous layer 52 of a thickness of 1000 nm is formed.

Further, in the step shown in FIG. 13C, by CVD or others, a silicon dioxide film is deposited to a thickness of 400 nm, and is then polished and flattened by CMP to form the high resistance region 51 and the element separation regions 12.

As shown above, according to the present embodiment, under the high resistance region 51 just below the inductor element 19, a porous layer is formed, and because of the shape of the porous layer, induction of an eddy current can hardly happen, so degradation of performance of the inductor element 19 can be suppressed. Further, the element separation region just below the inductor element is formed at the same depth with the element separation regions for separating MOS transistor. Therefore, occurrence of dishing or other local depressions generated during the flattening step by CMP can be reduced.

Fourth Embodiment

The present embodiment relates to an example of a CMOS device in which the rear surface of the semiconductor substrate just below an inductor element is ground and removed.

Figure 14:
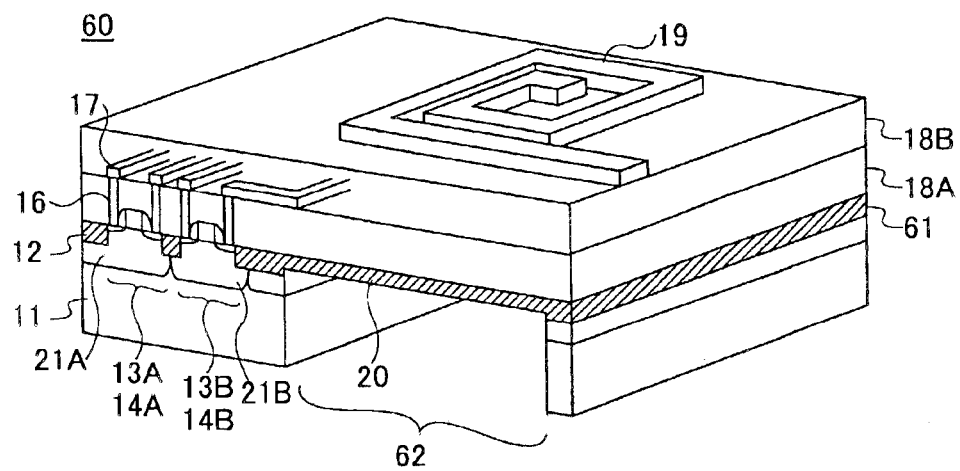
FIG. 14 is a perspective view of the CMOS device according to a fourth embodiment of the present invention.
Figure 15:
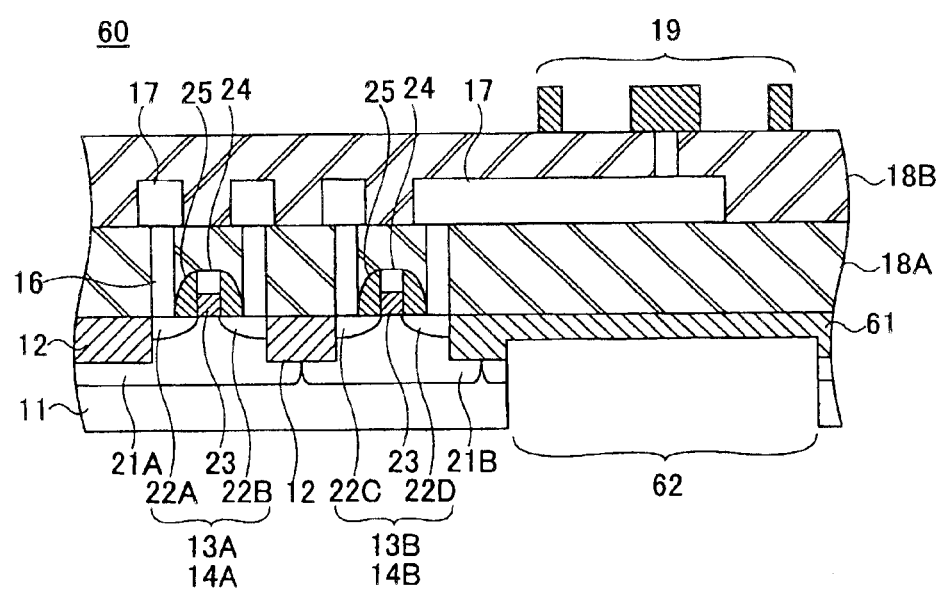
FIG. 15 is a sectional view of the CMOS device according to the fourth embodiment of the present invention.

FIG. 14 is a perspective view of the CMOS device according to the fourth embodiment of the present invention, and FIG. 15 is a sectional view of the same. In FIGS. 14 and 15, the same reference numerals are assigned to the same elements with those explained previously, and explanations thereof will be omitted.

Referring to FIGS. 14 and 15, the CMOS device 60 of the present embodiment comprises a semiconductor substrate 11, element separation regions 12 formed on the semiconductor substrate 11, device regions 13A and 13B separated by the element separation regions 12, p-channel and n-channel MOS transistors 14A and 14B formed in the device regions 13A and 13B, plugs 16 and an interconnection layer 17 connected to the p-channel and n-channel MOS transistors 14A and 14B, an interlayer insulating film 18, and an inductor element 19 in connection with the plugs 16 or the interconnection layer 17. In addition, only a high resistance region 61 is formed just below the inductor element 19, and a portion of the semiconductor substrate is removed from the rear surface, forming a recess 62. In other words, on the rear surface of the semiconductor substrate 11 corresponding to the inductor element 19, a recess 62 is provided to have an area equal to or greater than the area occupied by the inductor element 19.

For example, the recess 62 can be formed in the following way.

First, positioning holes are formed beforehand to penetrate the semiconductor substrate 11 from its major surface to its rear surface. These holes can be used as position references for masks during the resist process on the rear surface of the semiconductor substrate 11 corresponding to the inductor element 19. Note that patterning can also be performed on the rear surface of the semiconductor substrate 11 using a two-side aligner.

After forming a resist, using the resist as a mask, grinding is performed by dry etching to form the recess 62.

According to this embodiment, when current flows in the inductor element 19 formed on the semiconductor substrate 11, a magnetic flux is generated, and nearly perpendicularly interlinks with the semiconductor substrate 11. However, since there is only the high resistance region 61 just below the inductor element, induction of an eddy current can be prevented. Thus, degradation of performance of the inductor element 19 can be prevented.

Note that the step of grinding the rear surface of the semiconductor substrate 11 can be carried out either before formation of the element separation regions 12, or after formation of the inductor element. Further, in the present embodiment, the depth of the high resistance region 61 is set to be the same as that of element separation regions 12 for separating MOS transistors, but as in the first embodiment, the high resistance region 61 just below the inductor element 19 can be formed even deeper, and this reduces the amount of grinding for forming the recess 62.

In addition, a number of the recesses 62 may be provided. For example, on the rear surface and grooves in a grating manner can be formed over the area equal to or greater than that occupied by the inductor element 19. It is preferable that the bottom of each groove reach the high resistance region 61, so that the induced eddy current is divided.

Fifth Embodiment

The present embodiment relates to an example of a method for designing a mask for patterning a resist when forming an impurity region during fabrication of a CMOS device.

Figure 16:
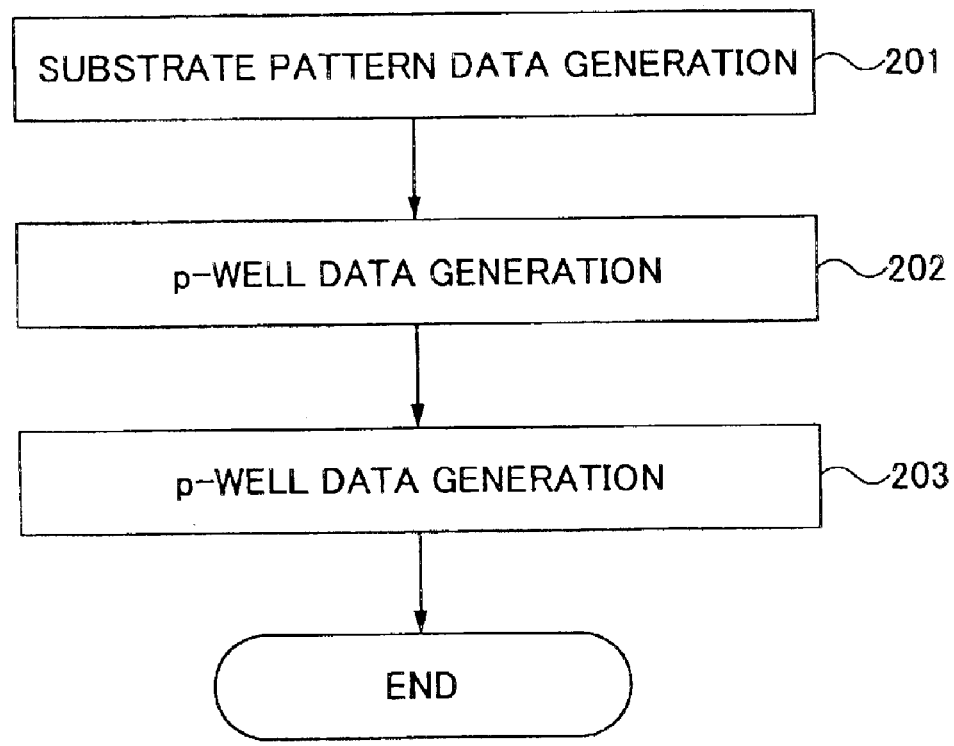
FIG. 16 is a flow chart showing an example of a design method according to a fifth embodiment of the present invention.

FIG. 16 is a flow chart showing an example of a design method according to the fifth embodiment of the present invention. Below, explanations will be given with reference to FIG. 16.

First, from CMOS device circuit design data, a pattern of the substrate region including the device region, the element separation region and others is generated by well-known methods (step 201). Next, based on this pattern, mask data for making an opening only in a portion for forming a p-well is generated (step 202). Next, based on the above pattern, mask data for making an opening only in a portion for forming an n-well is generated (step 203). By these steps, mask data for a p-well and an n-well are generated.

Figure 17A:
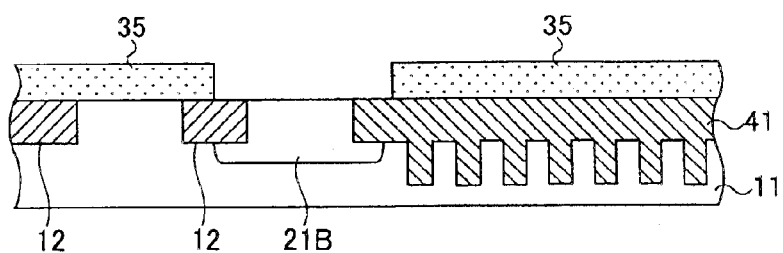
FIGS. 17A and 17B are views showing a fabrication process utilizing the design method according to the fifth embodiment.
Figure 17B:
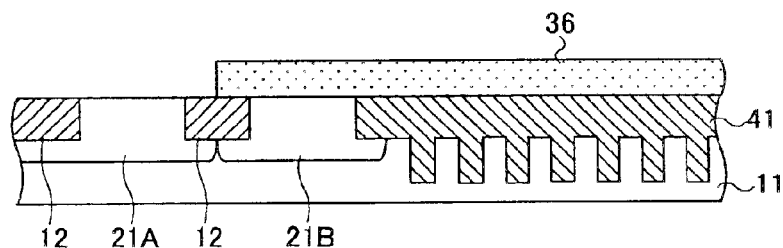

FIGS. 17A and 17B show an example of patterning a resist by photolithography after making masks using the p-well mask data and n-well mask data generated by the above method. Here, the CMOS device 40 of the second embodiment will be taken as an example.

Referring to FIG. 17A, first, using the mask made with the p-well data, the n-well device region 13A and the high resistance region 41 are covered by the resist 35. By those steps described in the first embodiment, a p-type impurity element is implanted to form a p-well region 21B.

Next, in the step shown in FIG. 17B, using a mask made with the n-well data, the p-well device region 13B and the high resistance region 41 are covered by the resist 36. By the same processing, an n-type impurity element is implanted to form an n-well region 21A.

Generating mask data in this way, since impurity elements are not implanted into the high resistance region 41, the semiconductor substrate between high resistance channels is not implanted by impurity elements, and the high substrate resistivity is maintained, so the induction of an eddy current can barely occur, and the induction of an eddy current is suppressed. Therefore, the degradation of performance of the inductor element 19 can be prevented.

As a modification to the fifth embodiment, a mask can be designed in the following way.

Figure 18:
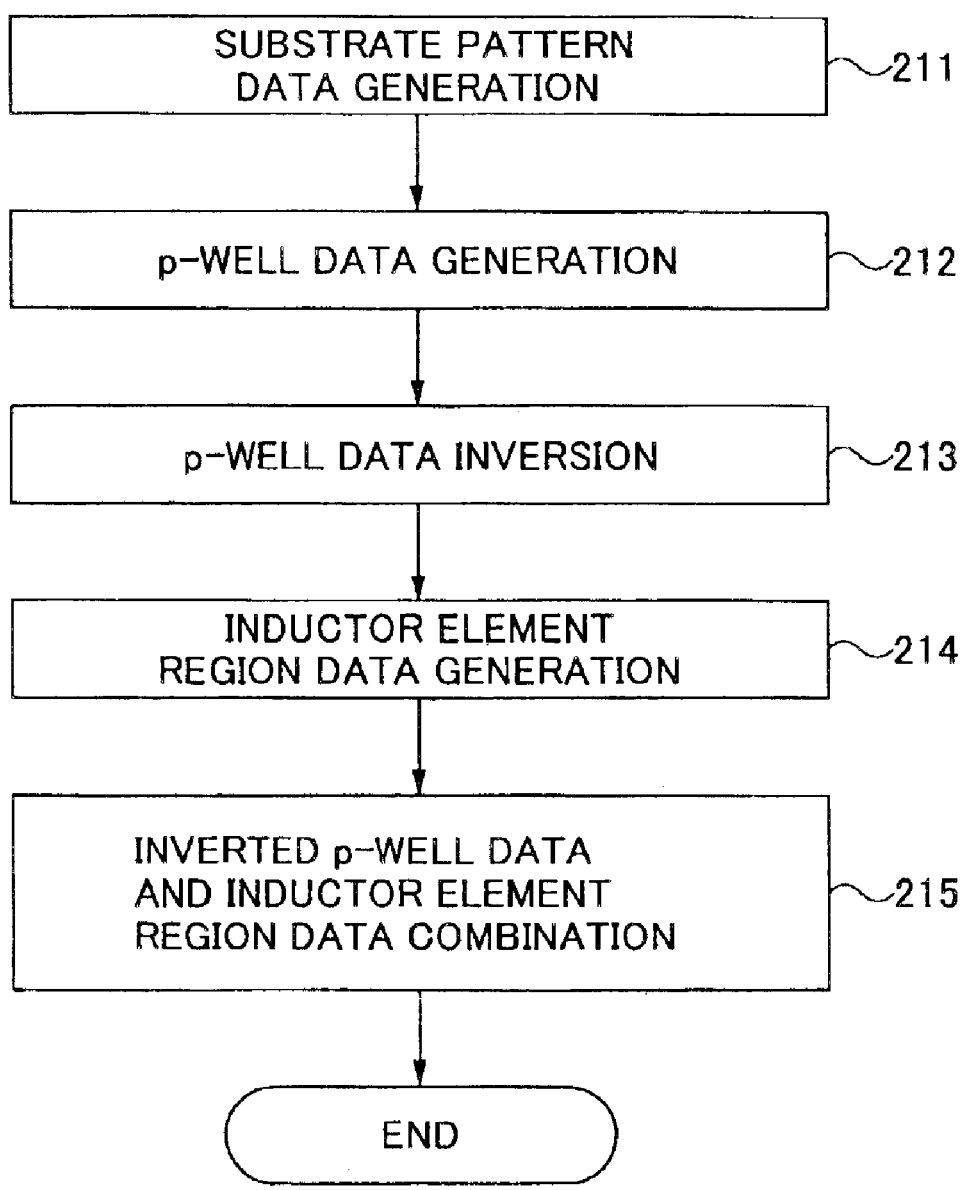
FIG. 18 is a flow chart showing an example of a design method according to a modification to the fifth embodiment of the present invention.

FIG. 18 is a flow chart showing another example of a design method according to the present embodiment. Below, explanations will be made with reference to FIG. 18.

First, from CMOS device circuit design data, a pattern of the substrate region including the device region, the element separation region and others is generated by well-known methods (step 211). Next, based on this pattern, mask data for making an opening only in a portion for forming a p-well is generated (referred to as p-well mask data) (step 212).

Next, by inverting this data, mask data (referred to as n-well mask data) for making an opening in other than the portion for forming the p-well is generated (step 213). Next, because the high resistance region just below the inductor element is opened, inductor device region data is generated (step 214) and is appended to and combined with the n-well mask data (step 215). In this way, both p-well mask data and n-well mask data are generated.

Masks made by using data generated in this way have the same effects as the fifth embodiment. Further, when generating mask data in this way, the amount of the inductor device region data is much smaller than that of the n-well data. So, comparing with the case in which p-well data and n-well data are generated separately, design work using CAD or others can be greatly reduced.

While the invention has been described with reference to specific embodiments chosen for purpose of illustration, it should be apparent that the invention is not limited to these embodiments, but numerous modifications could be made thereto by those skilled in the art without departing from the basic concept and scope of the invention.

For example, although CMOS devices are described as an example in the above embodiments, the present invention is also applicable to BiCMOS devices, and Si bipolar devices.

Summarizing the effect of the invention, as it has been clearly shown above, according to the present invention, by forming a high resistance region in a semiconductor substrate at a position deeper than an impurity diffusion region, it becomes possible to suppress induction of an eddy current in the high resistance region caused by the magnetic field created by an inductor element provided on the semiconductor substrate. In addition, by forming grooves or a porous portion in the high resistance region, the eddy current can be divided. As a result, a semiconductor device able to prevent performance degradation of the inductor element can be provided.

What is claimed is:

1. The semiconductor device comprising:

a semiconductor substrate having a predetermined substrate resistively;

a device region formed in the semiconductor substrate;

impurity diffusion regions formed in the semiconductor substrate;

an inductor element formed on a first surface of the semiconductor substrate;

a high resistance region formed in the semiconductor substrate facing the inductor element, said high resistance region having a resistively higher than that of the semiconductor substrate so as to prevent an occurrence of an eddy current induced by a magnetic field of the inductor element;

wherein the impurity diffusion regions are separated by the high resistance region in the semiconductor substrate below the inductor element; and wherein a depressed portion is formed on a second surface of the semiconductor substrate facing said inductor element.

2. The semiconductor device according to claim 1, wherein said depressed portion is formed to such a depth relative to the second surface that said high resistance region is able to be formed.

3. The semiconductor device according to claim 1, wherein said high resistance region is formed of silicon oxide.

4. The semiconductor device according to claim 1, wherein said high resistance region is formed from an oxide film.

5. A method for producing a semiconductor device, comprising the steps of:

forming a transistor in a device region in a semiconductor substrate;

forming an inductor element on a first surface of the semiconductor substrate above a resistance region near the device region; and forming a depressed portion on a second surface of the semiconductor substrate facing the inductor element so as to prevent an occurrence of an eddy current induced by a magnetic field of the inductor element, said depressed portion having an area equal to or greater than an area occupied by the inductor element.

6. The method according to claim 5, wherein said resistance region is formed from an oxide film.

7. The method as claimed in claim 5, wherein the step of forming the depressed portion is performed before a separation region of the device region is formed.

8. The method as claimed in claim 5, wherein the step of forming the depressed portion is performed after the inductor element is formed.

9. The method as claimed in claim 5, wherein the depressed portion is formed by etching the second surface of the semiconductor substrate.

10. The method as claimed in claim 5, further comprising a step of forming positioning holes penetrating the semiconductor substrate from the first surface to the second surface, said positioning holes being used as position references when forming the depressed portion.

* * * * *